US011988733B2

United States Patent
Bai et al.

(10) Patent No.: US 11,988,733 B2
(45) Date of Patent: May 21, 2024

(54) CROSS-DOMAIN NETWORK BASED MAGNETIC RESONANCE IMAGING UNDERSAMPLING PATTERN OPTIMIZATION AND RECONSTRUCTION METHOD

(71) Applicant: ZHEJIANG UNIVERSITY, Hangzhou (CN)

(72) Inventors: Ruiliang Bai, Hangzhou (CN); Zhaowei Cheng, Hangzhou (CN); Xinyu Jin, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/036,884

(22) PCT Filed: Dec. 13, 2022

(86) PCT No.: PCT/CN2022/138662
§ 371 (c)(1),
(2) Date: May 14, 2023

(87) PCT Pub. No.: WO2023/124971
PCT Pub. Date: Jul. 6, 2023

(65) Prior Publication Data
US 2023/0324486 A1    Oct. 12, 2023

(30) Foreign Application Priority Data

Dec. 31, 2021   (CN) .......................... 202111682080.X
Feb. 25, 2022   (CN) .......................... 202210176538.2

(51) Int. Cl.
*G01R 33/56*   (2006.01)
*G01R 33/48*   (2006.01)
(Continued)

(52) U.S. Cl.
CPC ..... *G01R 33/5608* (2013.01); *G01R 33/4818* (2013.01); *G06T 7/0012* (2013.01);
(Continued)

(58) Field of Classification Search
None
See application file for complete search history.

(56) References Cited

U.S. PATENT DOCUMENTS

2011/0286648 A1    11/2011   Sharif et al.
2022/0075017 A1*   3/2022    Sabuncu ............. A61B 5/7267

FOREIGN PATENT DOCUMENTS

CN    109350061    2/2019
CN    109557489    4/2019
(Continued)

OTHER PUBLICATIONS

Xue, Shengke, et al. "2D probabilistic undersampling pattern optimization for MR image reconstruction." Medical Image Analysis 77 (2022): 102346. (Year: 2022).*
(Continued)

*Primary Examiner* — Samah A Beg
(74) *Attorney, Agent, or Firm* — Jiwen Chen; Joywin IP Law PLLC (57) ABSTRACT

The present invention discloses the cross-domain network method for magnetic resonance imaging undersampling trajectory optimization in Fourier domain and reconstruction network in image domain. The method includes the following steps: obtaining a head MR image, preprocessing, and obtaining simulated fully sampled k-space data through Fourier Transform; separating the real and imaginary parts of the simulated fully sampled k-space data and independently storing them in two matrices with the same dimensions, then merging them into two channels as inputs to the cross-domain network; constructing the cross-domain net-
(Continued)

work, including the undersampling layer, the Inverse Fourier Transform layer, and the reconstruction network; training the cross-domain network until convergence; using the trained network to acquire and reconstruct the head MR image.

10 Claims, 5 Drawing Sheets

(51) Int. Cl.
*G06T 7/00* (2017.01)
*G06T 7/168* (2017.01)
*G06T 7/174* (2017.01)
*G06T 11/00* (2006.01)

(52) U.S. Cl.
CPC .............. *G06T 7/168* (2017.01); *G06T 7/174* (2017.01); *G06T 11/005* (2013.01); *G06T 11/006* (2013.01); *G06T 2207/10088* (2013.01); *G06T 2207/20056* (2013.01); *G06T 2207/20076* (2013.01); *G06T 2207/20084* (2013.01)

(56) References Cited

FOREIGN PATENT DOCUMENTS

CN 113096208 7/2021
CN 113538612 10/2021

OTHER PUBLICATIONS

Bahadir, Cagla D., et al. "Deep-learning-based optimization of the under-sampling pattern in MRI." IEEE Transactions on Computational Imaging 6 (2020): 1139-1152. (Year: 2020).*

* cited by examiner

CROSS-DOMAIN NETWORK BASED MAGNETIC RESONANCE IMAGING UNDERSAMPLING PATTERN OPTIMIZATION AND RECONSTRUCTION METHOD

This is a U.S. national stage application of PCT Application No. PCT/CN2022/138662 under 35 U.S.C. 371, filed Dec. 13, 2022 in Chinese, claiming priority of Chinese Application No. 202111682080.X, filed Dec. 31, 2021 and Application No. 202210176538.2, filed Feb. 25, 2022, all of which are hereby incorporated by reference.

TECHNICAL FIELD

The present invention belongs to the technical field of magnetic resonance imaging (MRI), and particularly relates to an MRI undersampling pattern optimization in Fourier domain and reconstruction in image domain based on a cross-domain network.

BACKGROUND TECHNOLOGY

Mainstream deep learning-based magnetic resonance (MR) image reconstruction methods are focused on designing complex neural networks to achieve the desired improvement in reconstruction image quality or complete inverse Fourier transform functionality. They only use undersampled k-space data or undersampled MR images as the input, ignoring the importance of optimizing the undersampling trajectory. The undersampling trajectory is a key factor in accelerating MRI and ensuring high-quality reconstruction. The sparsity of the undersampling determines the acceleration level. For example, a 10% undersampling rate corresponds to a 10-fold acceleration, and a 20% undersampling rate corresponds to a 5-fold acceleration. Generally, MRI undersampling only occurs in the phase encoding dimension and not in the frequency encoding dimension. For 2D MRI, which includes a frequency-encoding dimension and a phase-encoding dimension, only 1D undersampling can be taken. For traditional 3D MRI, which includes a frequency-encoding dimension and two phase-encoding dimensions, undersampling trajectory is generally 2D. Currently, available 2D undersampling trajectories include radial undersampling [P C Lauterbur. Image formation by induced local interactions: examples employing nuclear magnetic resonance[J]. Nature, Mar 1973. 242(5394):190-191], spiral undersampling [C B Ahn, J H Kim, Z H Cho. Highspeed spiral-scan echo planar NMR imaging[J]. IEEE Transactions on Medical Imaging, Mar 1986. 5(1):2-7], Gaussian undersampling [Robert L. Cook. Stochastic sampling in computer graphics[J]. ACM Transactions on Graphics (TOG), Jan 1986. 5(1):51-72], and Poisson undersampling [Thouis R. Jones. Efficient generation of Poisson-disk sampling patterns[J]. Journal of Graphics Tools, Jan 2006. 11(2):27-36]. However, these methods just follow the choices of previous studies, without proposing a deterministic theoretical basis, or analyzing which kind of undersampling trajectory is most suitable for specific k-space data. Currently, only a few studies have begun to focus on optimizing undersampling trajectories to improve MR image quality for specific k-space data during the acquisition phase.

Gözcü et al. [Baran Gözcü, Rabeeh Karimi Mahabadi, YenHuan Li, Efe Ilicak, Tolga Cukur, Jonathan Scarlett, Volkan Cevher. Learning-based compressive MRI[J]. IEEE Transactions on Medical Imaging, Jun 2018. 37(6):1394-1406] proposed a non-parametric greedy trajectory selection method (PFGMS) that iteratively updates the undersampling trajectory applied on k-space data and searches for an undersampling trajectory yielding higher image quality. However, because there are no adjustable parameters (non-neural network structure) during the learning of undersampling trajectories, the PFGMS method only relies on greedy iteration to expand the undersampling trajectory, which requires a lot of time to iterate and obtain the final undersampling trajectory and is not applicable on large-scale data. In addition, the optimization of the undersampling trajectory and the training of the CNN model in the PFGMS method are processed separately and updated alternately to obtain an approximate optimal solution, making it impossible to implement a joint training mechanism.

Huijben et al. [Iris A.M. Huijben, Bastiaan S. Veeling, Ruud J. G. van Sloun. Deep probabilistic subsampling for task-adaptive compressed sensing[C]// International Conference for Learning Representations, 2020:1-16] proposed a probabilistic subsampling method (DPS) based on probability representation, and introduced a two-layer fully connected network, a three-layer convolutional network, or a generative network to achieve end-to-end joint training mechanism. However, Huijben et al. only trained and verified on small image sets such as MNIST and CIFAR-10, and did not test on specific MR image sets. In order to break through the limitation of non-differentiable sampling point distribution, Gumbel-softmax was introduced as a continuous and differentiable approximation relaxation method in DPS, but this is not equivalent to real discrete sampling values, and only the top k sampling points with the highest probability values were selected, ignoring most of the high-frequency information and unable to provide a general theoretical analysis for the selection of sampling points.

Aggarwal et al. [Hemant Kumar Aggarwal, Mathews Jacob. J-MoDL: joint model-based deep learning for optimized sampling and reconstruction [J]. arXiv Preprint, 2019. 1911.02945:1-10]proposed a deep learning-based joint optimization method for undersampling trajectories and reconstruction models (J-MoDL), in which the concept of 2D undersampling trajectory optimization was proposed, and the trained model includes k-space data consistency operations (assuming the down-sampling trajectory is known) and U-Net [Olaf Ronneberger, Philipp Fischer, Thomas Brox. U-Net: convolutional networks for biomedical image segmentation [C]// Nassir Navab, Joachim Hornegger, William M Wells, Alejandro F Frangi. International Conference on Medical Image Computing and Computer-Assisted Intervention. Cham:Springer International Publishing, 2015:234-241] structure. However, Aggarwal et al. used a more complex training mechanism: 1) separately training the U-Net model; 2) separately training the undersampling trajectory; 3) training the undersampling trajectory and U-Net network simultaneously. This resulted in low training efficiency and a large amount of redundant computation. In order to enable the undersampling trajectory to participate in gradient updates, J-MoDL directly used continuous parameter values instead of discrete sampling values, resulting in a large difference between it and the real undersampling trajectory. Therefore, the results of the training have limited reference value for the discrete undersampling process. In addition, the undersampling trajectory assigns the sampling points too evenly for the low-frequency and high-frequency parts, without utilizing the distribution law of the importance of k-space data, and lacks theoretical analysis for the obtained undersampling trajectory.

Recently, Weiss et al. [Tomer Weiss, Sanketh Vedula, Ortal Senouf, Oleg Michailovich, Michael Zibulevsky, Alex Bronstein. Joint learning of Cartesian under-sampling and reconstruction for accelerated MRI[C]// IEEE International Conference on Acoustics, Speech and Signal Processing (ICASSP). IEEE, May 2020:8653-8657] proposed a method called J-UCR, which is a joint training of a Cartesian undersampling trajectory and the U-Net reconstruction network, to accelerate the MRI process. Weiss et al. [9] designed binary mask vector $\phi$ and continuous mask vector $\phi_c$. After each iteration in the training phase, $\phi_c$ is updated by the hard thresholding method with a threshold value ($\tau$) to obtain $\phi$. However, using a single threshold value in J-UCR results in inflexibility of the under-sampling trajectory. Additionally, the initialization process of the $\phi$ and $\phi_c$ vectors in J-UCR is too complicated, requiring manual design to allocate low-frequency and high-frequency parts according to a specific sampling rate. Because the undersampling trajectory heavily relies on specific initialization values, it does not significantly change during joint training, and the continuous value vector $\phi_c$ is not analyzed as a probability distribution. The training process of J-UCR only uses an $l_1$ loss function, resulting in insufficient supervision information for the undersampling optimization process, so the trained undersampling trajectory cannot reconstruct MR images with the best quality.

SUMMARY OF THE INVENTION

The object of the present invention is to provide a method for MRI undersampling trajectory optimization in Fourier domain and reconstruction in image domain based on cross-domain network method, which can effectively improve the reconstruction performance of MRI.

The technical solution adopted by the present invention comprises: A cross-domain network method for MRI undersampling trajectory optimization in Fourier domain and reconstruction in image domain comprises:

(1) acquiring and preprocessing head MR images, and obtaining simulated full-sampled k-space data through Fourier Transform;

(2) separating the real and imaginary parts of the simulated full-sampled k-space data obtained in step (1), and saving them in two matrices with the same dimensions independently, then merging them into two channels as input for the cross-domain network;

(3) constructing the cross-domain network, which includes an undersampling layer, an Inverse Fourier Transform layer, and a reconstruction network; training the network with data obtained in step (2) as input, wherein the undersampling layer simulates the process of k-space undersampling in real scenes, the Inverse Fourier Transform layer connects the Fourier domain with the image domain and obtain the undersampled MR images via the Inverse Fourier Transform; the reconstruction network recovers the details of the undersampled MR images to obtain the final image; and obtaining the optimized cross-domain network after training;

(4) using the cross-domain network obtained in step (3) to undersample and reconstruct head MR images:

(4-1) setting the sampling rate of the undersampling layer in step (3), optimizing the cross-domain network to obtain the optimal probability matrices and corresponding reconstruction networks under different sampling rates, generating the optimal undersampling trajectory based on the probability matrix and regional sampling distance constraint;

(4-2) quantitatively analyzing the relationship between the probability matrix and sampling rate according to the obtained optimal probability matrices under different sampling rate, obtaining the functional expression of the 3D probability curve $P_{face}$, the central probability curve $P_{center}$ and the marginal probability curve $P_{margin}$ by data fitting;

(4-3) based on the function expressions of $P_{face}$, $P_{center}$, $P_{margin}$, and the regional sampling distance constraint, generating probability matrices and undersampling trajectories under different sampling rates;

(4-4) undersampling k-space data based on the undersampling trajectory obtained in step (4-3) and generating undersampled MR images via the Inverse Fourier Transform layer, the reconstruction network reconstructs the undersampled MR images to recover the detailed content.

In step (1), the spatial resolution of each data set is 256×256×(240~320) (256×256 denotes the image size, and 240~320 denotes number of scanned slices). In the preprocessing stage, the data is normalized based on groups, and each slice is randomly rotated eight (8) times to weaken the influence of edge effects on the optimization and analysis of the undersampling trajectory, and to improve the generalization ability of the method considering the diversity of real scanning data.

In step (1), the present invention adopts the complex separation strategy for fast computation.

The Fourier matrix used for Fourier transformation is represented as:

$$F_n = \begin{bmatrix} 1 & 1 & 1 & \cdots & 1 \\ 1 & \omega & \omega^2 & \cdots & \omega^{n-1} \\ \vdots & \vdots & \vdots & \ddots & \vdots \\ 1 & \omega^{n-1} & \omega^{2(n-1)} & \cdots & \omega^{(n-1)(n-1)} \end{bmatrix}, \omega = \exp(i2\pi/n),$$

Where $F_n$ represents the Fourier matrix. $F_n^{-1} = F_n$ and $(\ )^H$ denotes the Hermitian transpose; Separating the real and imaginary parts of the matrix $F_n$ by the Euler's formula to obtain the following matrix:

$$F_n^{cos} = \begin{bmatrix} 1 & 1 & 1 & \cdots & 1 \\ 1 & \eta & \eta^2 & \cdots & \eta^{n-1} \\ \vdots & \vdots & \vdots & \ddots & \vdots \\ 1 & \eta^{n-1} & \eta^{2(n-1)} & \cdots & \eta^{(n-1)(n-1)} \end{bmatrix}, \eta = \cos(2\pi/n),$$

$$F_n^{sin} = \begin{bmatrix} 1 & 1 & 1 & \cdots & 1 \\ 1 & \kappa & \kappa^2 & \cdots & \kappa^{n-1} \\ \vdots & \vdots & \vdots & \ddots & \vdots \\ 1 & \kappa^{n-1} & \kappa^{2(n-1)} & \cdots & \kappa^{(n-1)(n-1)} \end{bmatrix}, \kappa = -\sin(2\pi/n).$$

Since the dimensions of the matrix can be determined in advance, the Fourier matrix $F_n$ can be calculated and saved in advance, without being added as learning parameters to the training process. The present invention has separated the real and imaginary parts of the k-space data (complex), and similarly, the real and imaginary parts of the Fourier matrix $F_n$ are separated before training to avoid the complex format and accelerate training.

In step (3), the undersampling operation is implemented by Hadamard product:

$$\hat{X}_u = \hat{X}_{in} \circ M_u = [\text{real}(XC) \circ M_u, \text{imag}(\mathcal{K}) \circ Mu] \in \mathbb{R}^{m \times n \times 2}$$

$M_u$ represents the undersampling matrix/trajectory, whose size is consistent with the k-space data. The values in $M_u$ are restricted to the discrete set $\{0,1\}$, where "0" denotes unsampled regions and "1" denotes sampled regions. $\hat{X}_{in}$ in denotes the input fully sampled k-space data, while $\hat{X}_u$ represents the undersampled k-space data.

In step (3), the method for constructing the undersampling layer is as follows:

(3-1) Designing the probability matrix Pu and initializing all elements to the undersampling rate. During the training process, imposing two constraints on the probability matrix: the difference between the average value of the probability matrix and the undersampling rate is within a certain error range as $\|\overline{P_u} - r\|_2 < \varepsilon$ ($\varepsilon = 0.1\%$); each probability value in the probability matrix satisfies $p \in (0, 1]$.

(3-2) Based on the probability matrix $P_u$, generating a sampling matrix $M_u$ according to the Bernoulli distribution during training.

(3-3) Based on the probability matrix $P_u$ and the sampling matrix $M_u$, designing the undersampling layer. In each training iteration, performing a forward calculation based on the sampling matrix $M_u$ to obtain the undersampled k-space data, and performing gradient propagation based on the probability matrix $P_u$ to update the parameters.

In step (3-1), the probability matrix $P_u$ in the undersampling layer is initialized with all element values set to the undersampling rate, and constrained to satisfy the condition $\|\overline{P_u} - r\|_2 < \varepsilon$ ($\varepsilon = 0.1\%$) throughout the training process. The initial state of the sampling matrix $M_u$ is generated from the probability matrix $P_u$ using the Bernoulli distribution. During training, the probability matrix values are restricted to the range of $p \in (0, 1]$. When p=0, the sampling distribution becomes meaningless, and the corresponding elements in the sampling matrix cannot participate in the update, leading to early convergence to a local minimum. When p>1, the gradient update process results in out-of-bounds values and causes abnormal sampling matrix $M_u$ generation.

In step (3-2), the sampling matrix $M_u$ consists of discrete values $\{0,1\}$ that enable forward computation. But the values are not differentiable and cannot be updated through backpropagation.

To overcome this problem, the present invention proposes a strategy for training the network structure automatically, where $M_u$ and $P_u$ are defined as a structural parameter and a control parameter respectively. Before each training iteration, the structural parameter $M_u$ used in the forward computation process is generated from the control parameter $P_u$ using the Bernoulli distribution to obtain discrete values. Then, during backpropagation, the control parameter is used to perform gradient updates. This process is repeated until the probability matrix $P_u$ converges.

$$\hat{X}_u = \hat{X}_{in} \circ M_u,$$

$$\frac{\partial}{\partial M_u} = \frac{\partial}{\partial \hat{X}_u} \frac{\partial \hat{X}_u}{\partial M_u} \approx \frac{\partial}{\partial \hat{X}_u} \frac{\partial \hat{X}_u}{\partial P_u},$$

-continued $$\frac{\partial}{\partial \hat{X}_{in}} = \frac{\partial}{\partial \hat{X}_u} \frac{\partial \hat{X}_u}{\partial \hat{X}_{in}} = \frac{\partial}{\partial \hat{X}_u} M_u \approx \frac{\partial}{\partial \hat{X}_u} P_u.$$

In this strategy, both the probability distribution characteristics of the sampling matrix $M_u$ are preserved and randomness is added during the training process, which allows the probability matrix $P_u$ to be optimized and stabilized for easy analysis of the common patterns.

In Step (3-2), the sampling matrix $M_u$ generated by the probability matrix $P_u$ through the Bernoulli distribution has rich randomness, which helps $P_u$ to be fully trained during the training process. However, after training, this randomness causes the sampling points generated by the same $P_u$ to be significantly different, leading to a dramatic change in the performance of the reconstructed network and making it difficult to further analyze the patterns of the probability matrix $P_u$.

In step (3), the input of the Inverse Fourier Transform layer (implementing the function of converting k-space data into MR images) is the undersampled k-space data, and the output is undersampled MR images generated via Inverse Fourier Transform. The forward and backward calculation process of the Inverse Fourier Transform layer can be expresses as:

$$\hat{X}_u(u, v) = \sum_{x=0}^{m-1}\sum_{y=0}^{n-1} X_u(x, y) e^{-i2\pi\left(\frac{ux}{m} + \frac{vy}{n}\right)},$$

$$X_u(x, y) = \frac{1}{mn}\sum_{u=0}^{m-1}\sum_{v=0}^{n-1} \hat{X}_u(u, v) e^{i2\pi\left(\frac{ux}{m} + \frac{vy}{n}\right)}.$$

In step (3), the reconstruction network adopts ten (10) common convolutional layers with a global skip connection to recover details of the MR images according to the undersampled MR image in spatial domain:

$$X_{rec} = X_u + f_{cnn}(X_u|\theta),$$

Where $X_u$ represents the undersampled MR image, $f_{cnn}$ represents the reconstruction network in image domain, and $\theta$ represents the network parameters to be optimized for $f_{cnn}$.

The reconstruction network provided by the present invention significantly improves the signal-to-noise (SNR) of the image while ensuring the universality of the cross-domain network.

The convolutional kernels in the first 9 layers of the reconstruction network have a size of 3×3, 16 channels, and a stride of 1. Each convolutional layer is followed by a rectified linear unit (ReLU) activation function. The 10th convolutional layer performs feature fusion with a kernel size of 3×3, 1 channel, and a stride of 1.

In step (3), during the training process, the loss function is based on traditional Euclidean loss constraint, which consists of undersampling loss and reconstruction loss:

$$L_{joint} = \lambda_1 \cdot L_{IFT} + \lambda_2 \cdot L_{rec}, \lambda_1, \lambda_2 \in [0,1],$$

where the undersampling loss is $L_{IFT} = 1/2\|X_u - Y_{rec}\|_F^2$, the reconstruction loss is $L_{rec} = 1/2\|X_{rec} - Y_{rec}\|_F^2$, and $Y_{rec}$ represents the real fully sampled MR image.

To alleviate the gradient vanishing problem caused by deep networks and enhance the training effect of the undersampling layer, the loss function not only includes the reconstruction loss but also the undersampling loss, providing the model with deep supervision. When both hyperparameters $\lambda_1$ and $\lambda_2$ are set to 1, the effect is optimal, indicating that the two loss functions' supervised information is equally important during the training process.

In step (4-1), the regional sampling distance constraint is applied during the generation of the sampling matrix $M_u$ based on the probability matrix $P_u$, which requires the distance between any sampling point and its nearest point should be nearly uniform, with a minimum distance of $r_0$ and a maximum distance of $2r_0$, in the region of isoprobability:

$$r_0 < \|M_u(x_j,y_j) - M_u(x_k,y_l)\|_2 < 2r_0 \, \forall i,k=1,2,\ldots,m, \forall j, l=1,2,\ldots,n.$$

In step (4-3), the function expressions of the 3D probability curve $P_{face}$, the central probability curve $P_{center}$ and the marginal probability curve $P_{margin}$ are as follows:

$$\sigma = \sqrt{\frac{\text{rate}}{\sqrt{\pi}}}, \, t_0 = \sqrt{6\frac{\text{rate}^{\frac{3}{2}}}{\pi^{\frac{3}{4}}} - 3\frac{\text{rate}^2}{\pi}}, \, t_1 = \frac{\text{rate}}{\sqrt{2}}, P_{min} = \frac{\text{rate}}{\sqrt{2\pi}},$$

$$t = \frac{z - 128}{128} \in [-1, 1], z = 0, 1, 2, \ldots, 256.$$

$$P_{center}(t) = \begin{cases} 1, & |t| \le t_1, \\ 1 - \frac{1}{100\sqrt{\text{rate}}} e^{\frac{8.1}{\text{rate}+2/3}(t-t_1)}, & t_1 < |t| < t_0, \\ \frac{\text{rate}}{\sqrt{2\pi}}, & t_0 \le |t| \le 1 \end{cases}$$

$$P_{face}(y, z) = \begin{cases} 1, & |d| \le t_1, \\ 1 - \frac{1}{100\sqrt{\text{rate}}} e^{\frac{8.1}{\text{rate}+\frac{2}{3}}(d-t_1)}, & t_1 < |d| < t_0, \\ \frac{\text{rate}}{\sqrt{2\pi}}, & t_0 \le |d| \le \sqrt{2} \end{cases}$$

$$d = \frac{\sqrt{(y-128)^2 + (z-128)^2}}{128} \in [0, \sqrt{2}],$$

$$\forall y = 0, 1, 2, \ldots, 256, \forall z = 0, 1, 2, \ldots 256.$$

$$P_{margin}(t) = \begin{cases} -\frac{\text{rate}}{3\sqrt{2\pi}\sigma^4} t^2 + \frac{2\text{rate}}{\sqrt{2\pi}\sigma}, & |t| < t_0, \\ P_{min}, & t_0 \le |t| \le 1 \end{cases};$$

Where rate is the total sampling ratio, $P_{min}=\text{rate}/\sqrt{2\pi}$; is the minimum sampling probability, z represents the coordinate value of the probability matrix $P_u$, and d represents the distance between a pixel point in the matrix $P_u$ and the center of the matrix.

Specifically, based on the required sampling rate, a series of parameters $\sigma$, $t_0$, $t_1$, and $P_{min}$ can be calculated. Then, generate the probability matrix $P_u$ using the formula $P_{face}$ and these parameters. By combining the probability matrix $P_u$ with the regional sampling distance constraint, a sampling matrix $M_u$ can be generated. The central probability curve $P_{center}$ and the marginal probability curve $P_{margin}$ are used to analyze the expression of the 3D probability curve $P_{face}$. The function expressions of $P_{face}$, $P_{center}$ and $P_{margin}$ under different sampling rates obtained by the present invention, combined with the regional sampling distance constraint, can generate corresponding undersampling trajectory, which is universal for 2D undersampling trajectory and used to undersample k-space data. The undersampled k-space data is then reconstructed into a undersampled MR image via the Inverse Fourier Transform layer. And the trained reconstruction network is used to restore the details of the undersampled MR image.

The present invention proposes a method for undersampling trajectory optimization in Fourier domain and reconstruction in image domain based on cross-domain network method, which optimizes the undersampling trajectory and the reconstruction network simultaneously. In addition, the relationship between the undersampling rate and the best undersampling probability matrix is quantitatively analyzed. The present invention consists of three parts: the 2D probabilistic undersampling layer simulating undersampling process, the Inverse Fourier Transform layer generating MR images from undersampled k-space data, and reconstruction network restoring details of undersampled MR images in spatial domain. The cross-domain network proposed in the present invention adopts k-space data obtained from real MR data through Fourier Transform. The overall model is supervised with only the traditional Euclidean loss constraint to discover the relationship between the probability distribution of the best 2D undersampling trajectory and the sampling rate (acceleration factor), after adequately training the 2D probabilistic undersampling layer and reconstruct the network model. The practicality of the 2D probabilistic undersampling layer and the joint optimization training mechanism proposed in the present invention is stronger and has better performance for different MR acquisition and reconstruction scenarios. The function expression of the best sampling probability distribution learned by the method provided in the present invention can provide theoretical basis for undersampling trajectory in 3D MR scan MRI scenarios. At the same time, the present invention uses real MR images of different modalities and health conditions for 3D MRI scans to demonstrate the robustness and universality of the undersampling trajectory proposed in the present invention. Compared with several existing undersampling strategies, the undersampling trajectory proposed in the present invention has significantly better reconstruction performance under the same sampling rate (acceleration factor) condition.

DETAILED DESCRIPTION OF THE EMBODIMENTS OF THE INVENTION

The present invention used T1-weighted head MR images from the public dataset MICCAI 2013 Grand Challenge on Multi-Atlas Labeling, and obtained simulated fully-sampled k-space data through Fourier Transform. Considering that the background of the head MR image has no information, the present invention preprocessed data by shifting the important tissue part of the MR image to center to avoid the edge artifact of the recovered image. In addition, considering the insufficient diversity due to the fixed morphology and direction of the head MR image, the present invention augmented training data by randomly rotating MR images from 0° to 360° for eight (8) times. Random rotations enriched the diversity of training set, and avoided biased convergence and unexpected overfitting situations.

The network proposed in the present invention was implemented based on Tensorflow with Keras APIs. The experiments were executed on an Ubuntu Linux server equipped with an Intel Xeon(R) Platinum CPU @ 2.50 GHz, total of 528 GB memory, and four NVIDIA Tesla V100 (32 GB) GPUs.

The cross-domain network method for MRI undersampling trajectory optimization in Fourier domain and reconstruction in image domain proposed in the present invention mainly comprises the following steps:

(1) Obtaining head MR images and randomly dividing them into training, validation, and test sets; Normalizing the data at the group level and randomly rotating each slice to increase data diversity; Obtaining simulated fully sampled k-space data through Fourier Transform.

Specifically, T1-weighted head MR images from the public dataset MICCAI 2013 Grand Challenge on Multi-Atlas Labeling were used. 200 and 10 groups were randomly selected from the training samples as the training and validation sets, respectively. 10 groups were randomly selected from the test samples as the test set. After data preprocessing, simulated fully sampled k-space data were obtained through Fourier Transform.

(2) Separating the real and imaginary parts of the simulated fully sampled k-space data obtained in step (1) and saving them in two matrices with the same dimensions independently. Then, merging them into two channels serving as the input of the joint optimization network.

This process is denoted as:

$$\hat{X}_{in}=[\text{real}(\mathcal{K}),\text{imag}(\mathcal{K})] \in \mathbb{R}^{m \times n \times 2}$$

wherein $\mathcal{K}$ represents the complex form of the simulated fully-sampled k-space data. This method avoids complex calculations in the frequency domain and does not result in any information loss.

Figure 1:
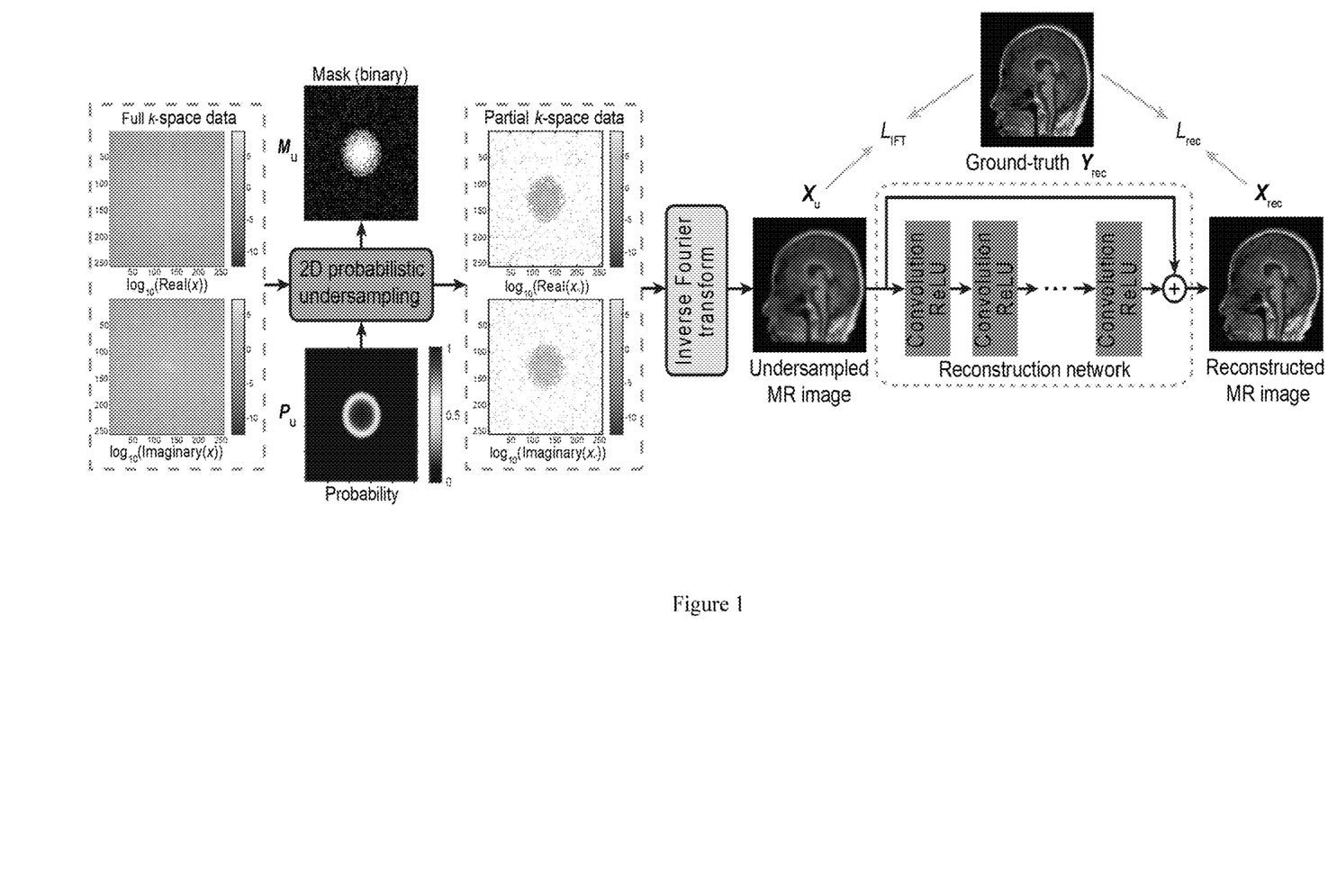
FIG. 1 presents the overall structure of the invented cross-domain network.

(3) Constructing the joint optimization network. As shown in FIG. 1, the overall structure includes the undersampling layer, the Inverse Fourier Transform layer, and the reconstruction network. The undersampling layer simulates the process of k-space undersampling in real scenarios. The inverse Fourier transform layer connects the Fourier domain with the image domain and obtain the undersampled MR images via the inverse Fourier transform. The reconstruction network recovers the details of the undersampled MR images to obtain the final image; Training the network with data obtained in step (2) as input and obtaining the joint optimization network. The specific process is as follows:

(3-1) Designing the probability matrix $P_u$ and initializing all its elements to the undersampling rate. During the training process, the probability matrix is subject to two constraints: the difference between the average value of the probability matrix and the undersampling rate is kept within a certain error range $\|\overline{P_u}-r\|_2 \leq \varepsilon$ ($\varepsilon=0.1\%$); the probability value of each point in the probability matrix satisfies $p \in (0, 1]$.

(3-2) Based on the probability matrix $P_u$ designed in step (4-1), generating a sampling matrix $M_u$ according to the Bernoulli distribution.

(3-3) Based on the probability matrix $P_u$ designed in step (4) and the sampling matrix $M_u$ generated in step (4-2), designing the undersampling probability layer. In each training iteration, performing forward calculation based on the sampling matrix $M_u$ to obtain the undersampled k-space data, and performing gradient propagation based on the probability matrix $P_u$ to update the parameters.

(3-4) Designing the inverse Fourier transform layer to connect the Fourie domain to the image domain and transforming the undersampled k-space data obtained in step (4-3) to the undersampled MR image.

The undersampled MR images can be obtained via Inverse Fourier Transform layer. The forward and backward calculation can be expressed as:

$$\hat{X}_u(u,v) = \sum_{x=0}^{m-1}\sum_{y=0}^{n-1} X_u(x,y)e^{-i2\pi(\frac{ux}{m}+\frac{vy}{n})},$$

$$X_u(x,y) = \frac{1}{mn}\sum_{u=0}^{m-1}\sum_{v=0}^{n-1} \hat{X}_u(u,v)e^{i2\pi(\frac{ux}{m}+\frac{vy}{n})}.$$

(3-5) Designing the reconstruction network in image domain to improve the signal-to-noise ratio (SNR) of the undersampled MR image in step (4-4) and recover the details.

It can be represented as:

$$X_{rec}=X_u+f_{cnn}(X_u|\theta),$$

where $X_U$ represents the undersampled MR image, $f_{cnn}$ represents the reconstruction network in image domain, and θ represents the network parameters to be optimized for $f_{cnn}$ Specifically, the setting of the first nine layers is kernel 3×3, channel=16, stride=1 and pad=0, followed by ReLU activation. The last convolutional layer performs feature fusion, with a kernel size of 3×3, one channel, and a stride of 1.

(3-6) Integrating the three parts in steps (3-3)-(3-5) into a joint optimization network. Training the network based on the data obtained in steps (1)-(2) until the network converges, and obtaining the optimized undersampling trajectory and reconstruction network.

During the training process, the training loss function is based on the traditional Euclidean loss constraint and consists of two parts: the undersampling loss and the reconstruction loss:

$$L_{joint}=\lambda_1 \cdot L_{IFT}+\lambda_2 \cdot L_{rec}, \lambda_1,\lambda_2 \in [0,1],$$

where the undersampling loss is $L_{IFT}=1/2\|X_u-Y_{rec}\|_F^2$, the reconstruction loss is $L_{rec}=1/2\|X_{rec}-Y_{rec}\|$, and $Y_{rec}$ represents the real fully sampled MR image.

Figure 3:
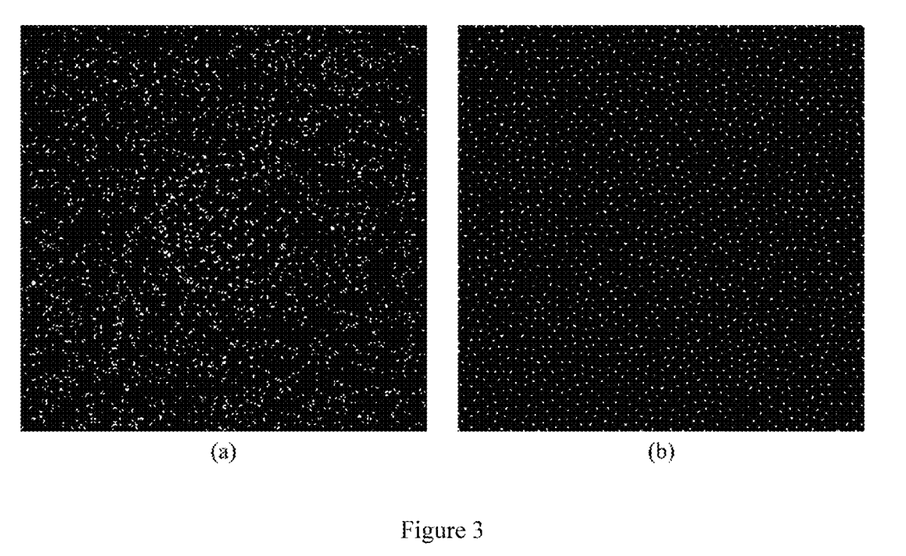
FIG. 3 presents the performance of the proposed regional sampling distance constraint. The results of the sampling matrix at sampling rate 10% with/out constraints: (a) the sampling matrix randomly generated by Bernoulli; (b) the sampling matrix generated under the regional sampling distance constraint.

(3-7) Based on the optimized probability matrix obtained in step (3-6), generating a sampling matrix under the regional sampling distance constraint, and fixing it as the probability matrix and sampling matrix in the joint optimization network. Finetuning the reconstruction network to obtain the final sampling matrix and reconstruction network.

As shown in FIG. 3. In addition to the total sampling rate constraint, the present invention proposes the regional sampling distance constraint, which requires the distance between any sampling point and its nearest point should be nearly uniform, ranging in [$r_0$, $2r_0$], in the region of iso-probability:

$$r_0 < \|M_u(x_i, y_j) - M_u(x_k, y_l)\|_2 < 2r_0 \forall i, k = 1, 2, \ldots, m, \forall j, l = 1, 2, \ldots, n.$$

(4) Setting the sampling rates to 10%, 20%, 30%, 40%, and 50%, respectively, and repeating steps (3-6)-(3-7) to train undersampling trajectories and reconstruction networks for different sampling rates.

(5) Quantitatively analyzing the relationship between the different sampling rates and corresponding probability matrices. Fitting the data to obtain the functional expressions for the cross-section probability curve $P_{center}$, the margin probability curve $P_{margin}$, and the three-dimensional surface plot $P_{face}$. Using these functional expressions and the sampling interval constraint, probability matrices and undersampling trajectories for different sampling rates can be generated. The only parameters that need to be manually configured in this process are the total sampling rate and the minimum sampling probability value constraint ($P_{min}$=rate/$\sqrt{2\pi}$), and there is no need for a large amount of hyperparameter tuning.

The function expressions for the 3D probability curve $P_{face}$, the central probability curve $P_{center}$ and the marginal probability curve $P_{margin}$ are as follows:

$$\sigma = \sqrt{\frac{\text{rate}}{\sqrt{\pi}}}, t_0 = \sqrt{6 \frac{\text{rate}^{\frac{3}{2}}}{\pi^{\frac{3}{4}}} - 3 \frac{\text{rate}^2}{\pi}}, t_1 = \frac{\text{rate}}{\sqrt{2}}, P_{min} = \frac{\text{rate}}{\sqrt{2\pi}},$$

$$t = \frac{z - 128}{128} \in [-1, 1], z = 0, 1, 2, \ldots, 256.$$

$$P_{center}(t) = \begin{cases} 1, & |t| \le t_1, \\ 1 - \frac{1}{100\sqrt{\text{rate}}} e^{\frac{8.1}{\text{rate}+2/3}(t-t_1)}, & t_1 < |t| < t_0, \\ \frac{\text{rate}}{\sqrt{2\pi}}, & t_0 \le |t| \le 1 \end{cases}$$

$$P_{face}(y, z) = \begin{cases} 1, & |d| \le t_1 \\ 1 - \frac{1}{100\sqrt{\text{rate}}} e^{\frac{8.1}{\text{rate}+\frac{2}{3}}(d-t_1)}, & t_1 < |d| < t_0, \\ \frac{\text{rate}}{\sqrt{2\pi}}, & t_0 \le |d| \le \sqrt{2} \end{cases}$$

$$d = \frac{\sqrt{(y-128)^2 + (z-128)^2}}{128} \in [0, \sqrt{2}],$$

$$\forall y = 0, 1, 2, \ldots 256, \forall z = 0, 1, 2, \ldots, 256.$$

$$P_{margin}(t) = \begin{cases} -\frac{\text{rate}}{3\sqrt{2\pi} \sigma^4} t^2 + \frac{2\text{rate}}{\sqrt{2\pi} \sigma}, & |t| < t_0, \\ P_{min}, & t_0 \le |t| \le 1 \end{cases};$$

Among them, rate is the total sampling ratio, $P_{min}$=rate/$\sqrt{2\pi}$ is the restriction of the minimum sampling probability value, z represents the coordinate value of the probability matrix $P_u$ and d represents the distance between the pixel point in the probability matrix $P_u$ and the center of the matrix.

Figure 2:
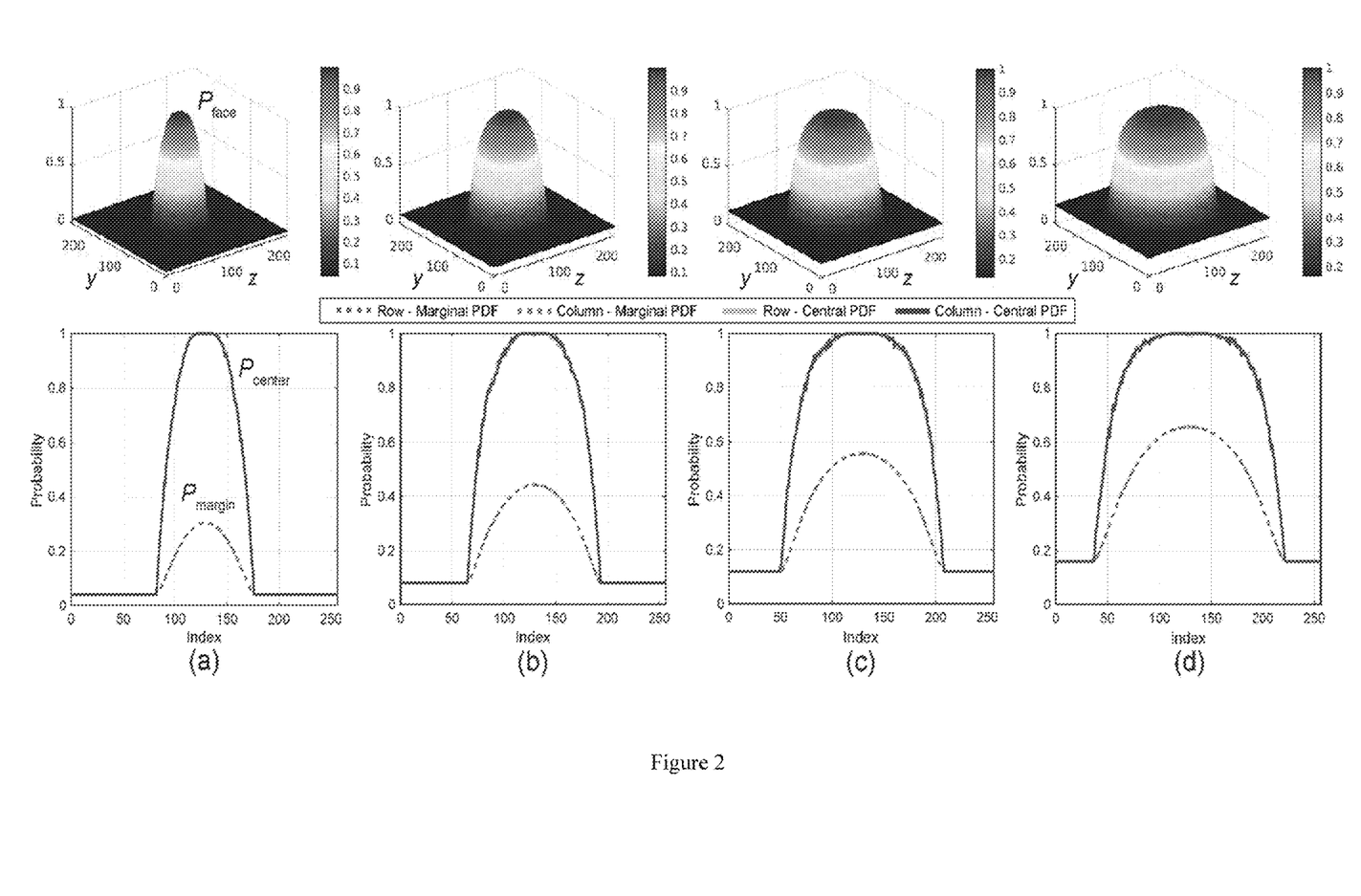
FIG. 2 presents the results of the quantitative analysis of the optimized 2D probability matrix in the present invention: the 3D probability curve $P_{face}$, the central probability curve $P_{center}$ and the marginal probability curve $P_{margin}$ with undersampling rates of (a) 10%, (b) 20%, (c) 30%, and (d) 40%.

The probability matrix obtained at different sampling rates in step (5) has a high degree of regularity. Continuing with quantitative analysis, the present invention explores the 3D probability curve $P_{face}$, the central probability curve (solid line) $P_{center}$, and the marginal probability curve (dashed line) $P_{margin}$ at different sampling rates, as shown in FIG. 2. As the sampling rate increases, the sampling rate in the central area gradually increases, and the minimum sampling rate $P_{min}$ in the high-frequency area also gradually increases. In addition, since the probability matrix is highly center-symmetric, the results of the central probability curve $P_{center}$ and the marginal probability curve $P_{margin}$ are completely coincident. Therefore, the present invention only needs to focus on analyzing any one direction of the curve. The maximum value of the section probability curve $P_{center}$ is 1, and the minimum value is the preset $P_{min}$. As the sampling rate increases, the shape of the curve becomes increasingly "wide." The maximum value of the marginal probability curve $P_{margin}$ increases with the sampling rate, and the minimum value is the preset $P_{min}$. As the sampling ratio increases, the shape of the curve becomes increasingly "tall" and "wide." After curve data fitting, the present invention proposes specific expressions for the above probability distributions.

In step (6), the k-space data of the MR image is obtained using the undersampling trajectory in step (5), and the Inverse Fourier Transform layer reconstructs the undersampled MR image from the k-space data. The reconstruction network reconstructs and restores the details from the undersampled MR image.

When the sampling rate in step (6) is the same as in step (4), the reconstruction network in step (4) is used. When they are different, the reconstruction network for this sampling rate needs to be retrained.

In order to test the probability undersampling strategy proposed in the present invention, the present invention selects some existing undersampling methods and compares the results under the condition of 10%-50% sampling rates, corresponding to 10-2 times acceleration. The compared methods include JCUR, PFGMS, J-MoDL, LOUPE, Gaussian, and Poisson. This invention uses the above undersampling trajectory (partly fixed and partly trainable) to replace the sampling matrix in the undersampling layer proposed in the present invention and trains the reconstruction network. Finally, the SNR of the reconstructed MR image is quantitatively compared. Since the model parameters of different sampling rates cannot be shared, the present invention trains multiple models for testing under different sampling rates.

Analyzing the relationship between the different sampling rates and corresponding probability matrices quantitatively. Obtaining the functional expressions of the 3D probability curve $P_{face}$, the central probability curve $P_c$enter and the marginal probability curve $P_{margin}$ by data fitting and generate probability matrices under different sampling rates. Then generating undersampling trajectories based on probability matrices and regional sampling distance constraint.

The only parameters that need to be manually configured in this process are the total sampling rate and the minimum sampling probability value constraint $P_{min}$=rate/$\sqrt{2\pi}$, without requiring a large amount of hyperparameter adjustments. The sampling probability function and the optimal undersampling trajectory can be deployed as a real undersampling strategy in MRI scanners, achieving the goal of high SNR MR image acquisition and reconstruction under limited sampling rates.

Figure 4:
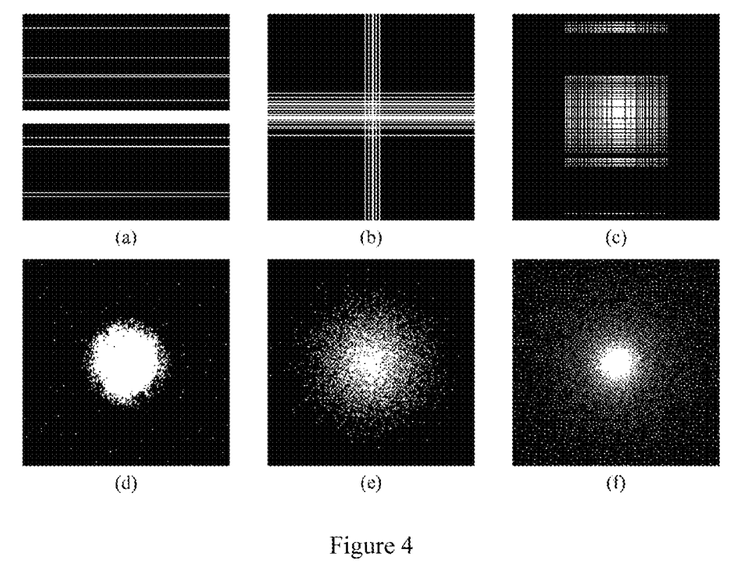
FIG. 4 presents several compared undersampling trajectories: (a) J-CUR; (b) PFGMS; (c) J-MoDL; (d) LOUPE; (e) Gaussian; (f) Poisson.
Figure 5:
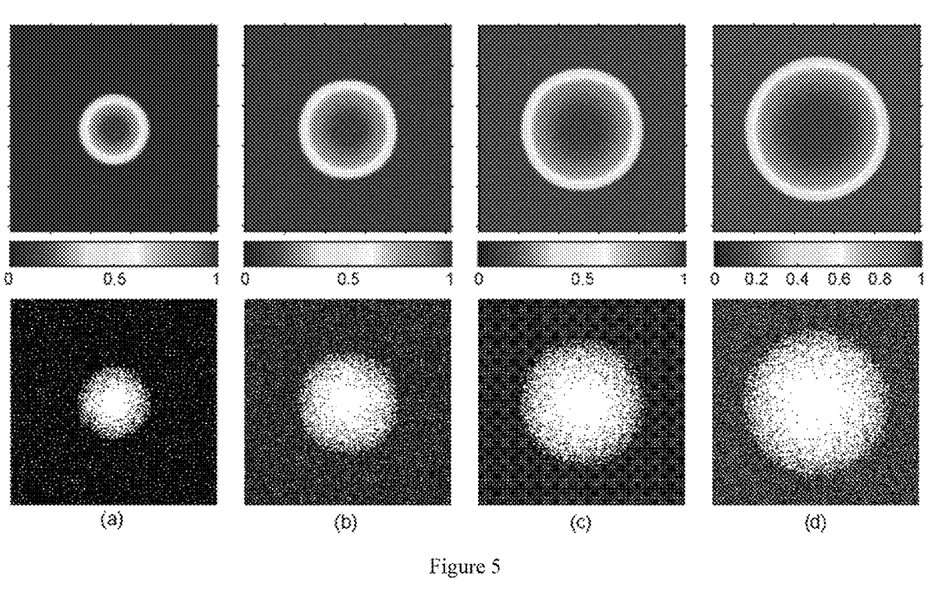
FIG. 5 presents the results of the 2D probabilistic undersampling layer proposed in the present invention when only using undersampling loss for training without reconstruction network. The first row shows the probability matrix, and the second row shows the sampling matrix generated under regional sampling distance constraint. The undersampling rates are (a) 10%, (b) 20%, (c) 30%, and (d) 40%.

To compare the methods of undersampling trajectories learned using the same data-driven approach with traditional undersampling methods, the present invention adopted following compared methods: J-CUR (FIG. 4 (a)), PFGMS (FIG. 4 (b)), J-MoDL (FIG. 4 (c)), LOUPE (FIG. 4 (d)), Gaussian (FIG. 4 (e)), and Poisson (FIG. 4 (f)). It can be found that the undersampling trajectories of J-CUR and PFGMS collect too little information in the high-frequency part, while the undersampling trajectory of the J-MoDL collects information from the low-frequency and high-frequency parts in equally, which all lead to relatively low SNR in the reconstructed MR images. In contrast, the probability matrix and undersampling trajectories obtained by the present invention (as shown in FIG. 5: the 2D probabilistic undersampling layer trained only with undersampling loss in the absence of a reconstruction network, the first row represents the probability matrix, and the second row represents the sampling matrix generated under the stability constraint condition; the undersampling ratios are (a) 10%, (b) 20%, (c) 30%, and (d) 40%) can allocate the sampling points to the low- and high-frequency regions of k-space reasonably, with the highest probability for low-frequency area located at the center of matrix, which presents a highly symmetrical trajectory of concentric circles with rapid decreasing probability values from the center to the edges. This data-driven invention is applicable to different types of MR data. Meanwhile, the probability matrix trained by the present invention is also considered as the importance distribution of the k-space sampling points: the energy in the central low-frequency part is high and vital to the overall structure of the reconstructed MR images, while the energy in the high-frequency part is low but crucial to improving the complex details of the MR images.

Figure 6:
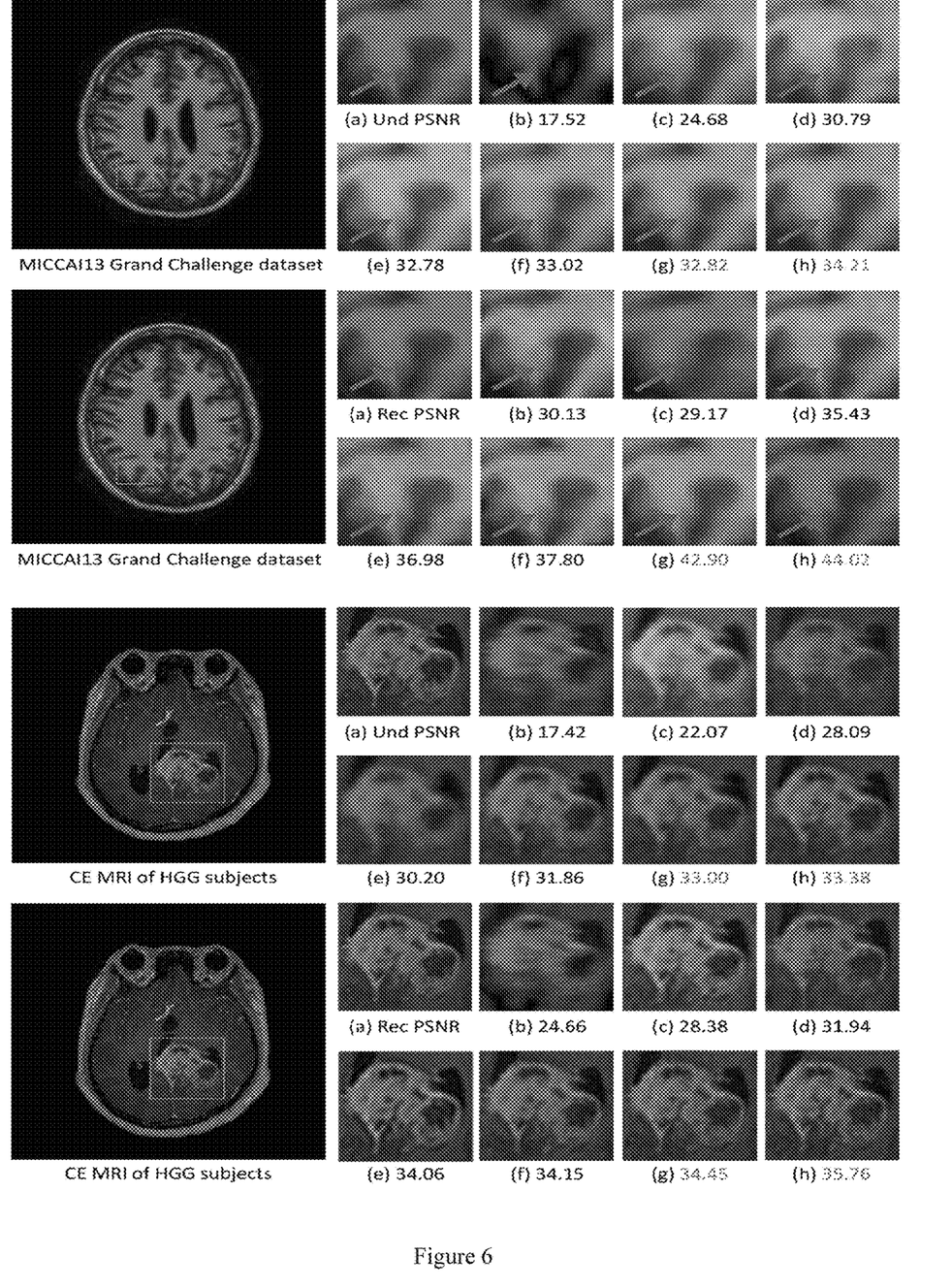
FIG. 6 presents the test examples of the optimized undersampling trajectory and reconstruction network in the MIC-CAI2013 test set and the dynamic contrast-enhanced magnetic resonance imaging dataset of high-grade glioma patients in the present invention. PSNR, peak signal-to-noise ratio.

As shown in FIG. 6, we tested the performance of the present invention on two different datasets, one of which is independently and identically distributed with the training set, and the other is dynamic contrast-enhanced magnetic resonance images of high-grade glioma patients.

From the results, it can be concluded that the joint optimization undersampling trajectory and reconstruction network proposed by the present invention can improve the quality of both undersampled and reconstructed of MR images, and can perform well on data with different distributions compared to other methods, proving the universality of the present invention.

The invention claimed is:

1. A magnetic resonance imaging (MRI) undersampling and reconstruction method based on a cross-domain network, wherein the method comprises:
   (1) acquiring and preprocessing head magnetic resonance (MR) images, and obtaining simulated full-sampled k-space data through Fourier Transform;
   (2) separating real and imaginary parts of the simulated full-sampled k-space data obtained in step (1), and saving real and imaginary parts in two matrices with same dimensions independently, then merging the real and imaginary parts into two channels as input for the cross-domain network;
   (3) constructing the cross-domain network, which includes an undersampling layer, an Inverse Fourier Transform layer, and a reconstruction network, by training the network with data obtained in step (2) as input, the undersampling layer simulating a process of k-space undersampling in real scenes, the Inverse Fourier Transform layer connecting the Fourier domain with an image domain and obtaining undersampled MR images via the Inverse Fourier Transform, the reconstruction network recovering details of the undersampled MR images to obtain a final image, after completing the training, and obtaining a trained cross-domain network;
   (4) using the trained cross-domain network obtained in step (3) to undersample and reconstruct head MR images:
   (4-1) setting different sampling rates of the undersampling layer in step (3), optimizing the trained cross-domain network to obtain probability matrices and corresponding reconstruction networks under the different sampling rates, generating optimal undersampling trajectories based on the probability matrices and regional sampling distance constraints;
   (4-2) quantitatively analyzing the relationship between the probability matrices and the different sampling rates according to the probability matrices under the different sampling rates, obtaining functional expressions of a 3D probability curve $P_{face}$, a central probability curve $P_{center}$ and a marginal probability curve $P_{margin}$ by data fitting;
   (4-3) based on the functional expressions of $P_{face}$, $P_{center}$, $P_{margin}$, and the regional sampling distance constraints, generating probability matrices and undersampling trajectories under the different sampling rates;
   (4-4) undersampling k-space data based on the undersampling trajectories obtained in step (4-3) and generate undersampled MR images via the Inverse Fourier Transform layer, the reconstruction network reconstructing the undersampled MR images to recover the details.

2. The magnetic resonance imaging (MRI) undersampling and reconstruction method based on a cross-domain network according to claim 1, wherein the Fourier matrix used in the Fourier Transformation of the step (1) is represented as:

$$F_n = \begin{bmatrix} 1 & 1 & 1 & \cdots & 1 \\ 1 & \omega & \omega^2 & \cdots & \omega^{n-1} \\ \vdots & \vdots & \vdots & \ddots & \vdots \\ 1 & \omega^{n-1} & \omega^{2(n-1)} & \cdots & \omega^{(n-1)(n-1)} \end{bmatrix}, \omega = \exp(-i2\pi/n),$$

where $F_n$ represents the Fourier matrix, $F_n^{-1} = F_n^H$ and $(\ )^H$ denotes the Hermitian transpose, n represents length or width of an image;

separating real part and imaginary part of the matrix $F_n$ by the Euler's formula to obtain the following matrix:

$$F_n^{\cos} = \begin{bmatrix} 1 & 1 & 1 & \cdots & 1 \\ 1 & \eta & \eta^2 & \cdots & \eta^{n-1} \\ \vdots & \vdots & \vdots & \ddots & \vdots \\ 1 & \eta^{n-1} & \eta^{2(n-1)} & \cdots & \eta^{(n-1)(n-1)} \end{bmatrix}, \eta = \cos(2\pi/n),$$

$$F_n^{\sin} = \begin{bmatrix} 1 & 1 & 1 & \cdots & 1 \\ 1 & \kappa & \kappa^2 & \cdots & \kappa^{n-1} \\ \vdots & \vdots & \vdots & \ddots & \vdots \\ 1 & \kappa^{n-1} & \kappa^{2(n-1)} & \cdots & \kappa^{(n-1)(n-1)} \end{bmatrix}, \kappa = -\sin(2\pi/n);$$

wherein n represents length or width of an image.

3. The magnetic resonance imaging (MRI) undersampling and reconstruction method based on a cross-domain network according to claim 1, wherein, in step (3), the undersampling is implemented by Hadamard product:

$$\hat{X}_u = \hat{X}_{in} \circ M_u = [\text{real}(k) \circ M_u, \text{imag}(k) \circ M_u] \in \mathbb{R}^{m \times n \times 2}$$

$M_u$ represents undersampling matrix or the optimal undersampling trajectories, whose size is consistent with the k-space data; the values in $M_u$ are restricted to the discrete set $\{0,1\}$, where "0" denotes unsampled regions and "1" denotes sampled regions; $\hat{X}_{in}$ in denotes the input fully sampled k-space data, while $\hat{X}_u$ represents the undersampled k-space data; m and n represents length and width of an image, respectively.

4. The magnetic resonance imaging (MRI) undersampling and reconstruction method based on a cross-domain network according to claim 3, wherein, in step (3), the method for constructing the undersampling layer is as follows:

(3-1) designing a 2D probability matrix $P_u$ and initializing all elements to an undersampling rate, during the training process, imposing two constraints on the probability matrix $P_u$: the difference between the average value of the probability matrix $P_u$ and the undersampling rate is within a certain error range as $\|\overline{P_u} - r\|_2 \le \varepsilon$ ($\varepsilon = 0.1\%$); each element in the probability matrix satisfies $p \in (0, 1]$;

(3-2) based on the probability matrix $P_u$, generating the undersampling matrix or the optimal undersampling trajectories $M_u$ according to the Bernoulli distribution during training;

(3-3) based on the probability matrix $P_u$ and the undersampling matrix or the optimal undersampling trajectories $M_u$, designing the undersampling layer, in each training iteration, performing a forward calculation based on the undersampling matrix or the optimal undersampling trajectories $M_u$ to obtain the undersampled k-space data, and performing gradient propagation based on the probability matrix $P_u$ to update parameters.

5. The magnetic resonance imaging (MRI) undersampling and reconstruction method based on a cross-domain network according to claim 1, wherein, in step (3), the input of the Inverse Fourier Transform layer is the undersampled k-space data, and the output is the undersampled MR images generated via Inverse Fourier Transform; the forward and backward calculation process of the Inverse Fourier Transform layer are expressed as:

$$\hat{X}_u(u,v) = \sum_{x=0}^{m-1}\sum_{y=0}^{n-1} X_u(x,y) e^{-i2\pi(\frac{ux}{m} + \frac{vy}{n})},$$

$$X_u(x,y) = \frac{1}{mn}\sum_{u=0}^{m-1}\sum_{v=0}^{n-1} \hat{X}_u(u,v) e^{i2\pi(\frac{ux}{m} + \frac{vy}{n})}.$$

wherein $\hat{X}_u(u, v)$ represents frequency domain value at coordinates (u, v) in frequency domain space; $X_u(x, y)$ represents time domain value at coordinate (x, y) in time domain space; m and n represent length and width of a sampling matrix, respectively.

6. The magnetic resonance imaging (MRI) undersampling and reconstruction method based on a cross-domain network according to claim 1, wherein, in step (3), the reconstruction network adopts 10 common convolutional layers with a global skip connection to recover the details of the MR images according to the undersampled MR images in image domain:

$$X_{rec} = X_u + f_{cnn}(X_u|\theta),$$

where $X_{rec}$ represents the reconstructed MR image, $X_U$ represents the undersampled MR image, $f_{cnn}$ represents the reconstruction network in image domain, and $\theta$ represents the network parameters to be optimized for $f_{cnn}$.

7. The magnetic resonance imaging (MRI) undersampling and reconstruction method based on a cross-domain network according to claim 6, wherein the first nine convolutional layers are set with kernel size of 3×3, channel number of 16, stride of 1 and pad of 0; each convolutional layer is followed by a rectified linear unit (ReLU) activation function; the last convolutional layer performs feature fusion, with a kernel size of 3×3, 1 channel, and a stride of 1.

8. The magnetic resonance imaging (MRI) undersampling and reconstruction method based on a cross-domain network according to claim 1, wherein in step (3), during the training process, a loss function is based on traditional Euclidean loss constraint, which consists of undersampling loss and reconstruction loss:

$$L_{joint} = \lambda_1 \cdot L_{IFT} + \lambda_2 \cdot L_{rec}, \lambda_1, \lambda_2 \in [0,1],$$

where the undersampling loss $L_{IFT} = 1/2 \|X_u - Y_{rec}\|_F^2$, and the reconstruction loss $L_{rec} = 1/2 \|X_{rec} - Y_{rec}\|_F^2$, where $Y_{rec}$ represents the real fully sampled MR image; $X_u$ represents the undersampled MR image, $X_{rec}$ represents the reconstructed MR image, and F represents Frobenius norm.

9. The magnetic resonance imaging (MRI) undersampling and reconstruction method based on a cross-domain network according to claim 1, wherein, in step (4-1), the regional sampling distance constrains is applied during the generation of the undersampling matrix or the optimal undersampling trajectories $M_u$ based on a probability matrix $P_u$, which requires the distance between any sampling point and its nearest point should be nearly uniform, with a minimum distance of $r_0$ and a maximum distance of $2r_0$, in the region of isoprobability:

$$r_0 < \|M_u(x_j, y_j) - M_u(x_k, y_l)\|_2 < 2r_0 \forall i, k = 1, 2, \ldots, m, \forall j, l = 1, 2, \ldots, n.$$

10. The magnetic resonance imaging (MRI) undersampling and reconstruction method based on a cross-domain network according to claim 1, wherein, in step (4-3), the functional expressions of the 3D probability curve $P_{face}$, the central probability curve $P_{center}$ and the marginal probability curve $P_{margin}$ are as follows:

$$\sigma = \sqrt{\frac{\text{rate}}{\sqrt{\pi}}}, \ t_0 = \sqrt{6\frac{\text{rate}^{\frac{3}{2}}}{\pi^{\frac{3}{4}}} - 3\frac{\text{rate}^2}{\pi}}, \ t_1 = \frac{\text{rate}}{\sqrt{2}}, P_{min} = \frac{\text{rate}}{\sqrt{2\pi}},$$

$$t = \frac{z - 128}{128} \in [-1, 1], z = 0, 1, 2, \ldots, 256,$$

$$P_{center}(t) = \begin{cases} 1, & |t| \le t_1, \\ 1 - \frac{1}{100\sqrt{\text{rate}}} e^{\frac{8.1}{\text{rate}+2/3}(t-t_1)}, & t_1 < |t| < t_0, \\ \frac{\text{rate}}{\sqrt{2\pi}}, & t_0 \le |t| \le 1 \end{cases}$$

$$P_{face}(y, z) = \begin{cases} 1, & |d| \le t_1, \\ 1 - \frac{1}{100\sqrt{\text{rate}}} e^{\frac{8.1}{\text{rate}+\frac{2}{3}}(d-t_1)}, & t_1 < |d| < t_0, \\ \frac{\text{rate}}{\sqrt{2\pi}}, & t_0 \le |d| \le \sqrt{2} \end{cases}$$

-continued $$d = \frac{\sqrt{(y-128)^2 + (z-128)^2}}{128} \in [0, \sqrt{2}],$$
$$\forall y = 0, 1, 2, \ldots 256, \forall z = 0, 1, 2, \ldots, 256,$$

$$P_{margin}(t) = \begin{cases} -\frac{rate}{3\sqrt{2\pi}\sigma^4}t^2 + \frac{2rate}{\sqrt{2\pi}\sigma}, & |t| < t_0, \\ P_{min}, & t_0 \leq |t| \leq 1 \end{cases};$$

where rate is a total sampling ratio, $P_{min}$=rate/$\sqrt{2\pi}$ is the minimum sampling probability, z represents coordinate value of a probability matrix $P_u$, and d represents a distance between a pixel point in the probability matrix $P_u$ and a center of the probability matrix $P_u$.

* * * * *